(12) United States Patent
Tong et al.

(10) Patent No.: US 12,387,693 B2
(45) Date of Patent: Aug. 12, 2025

(54) GATE ROW DRIVING CIRCUIT AND DRIVING METHOD THEREOF, AND DISPLAY SUBSTRATE

(71) Applicant: HKC CORPORATION LIMITED, Shenzhen (CN)

(72) Inventors: Chenguang Tong, Shenzhen (CN); Mengling Wang, Shenzhen (CN); Min Chen, Shenzhen (CN); Longxin Xiao, Shenzhen (CN); Junfeng Xie, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/899,494

(22) Filed: Sep. 27, 2024

(65) Prior Publication Data

US 2025/0124888 A1  Apr. 17, 2025

(30) Foreign Application Priority Data

Oct. 12, 2023  (CN) .......................... 202311316104.9

(51) Int. Cl.
  *G09G 3/36*  (2006.01)
  *H03K 17/687*  (2006.01)
  *H10N 10/80*  (2023.01)

(52) U.S. Cl.
  CPC ....... *G09G 3/3677* (2013.01); *H03K 17/6871* (2013.01); *G09G 2320/02* (2013.01);
  (Continued)

(58) Field of Classification Search
  CPC ............. G09G 3/3677; G09G 2320/02; G09G 2330/021; G09G 2354/00; G09G 2320/041; H03K 17/6871; H10N 10/80
  See application file for complete search history.

(56) References Cited

U.S. PATENT DOCUMENTS

2005/0184946 A1* 8/2005 Pyoun ................. G09G 3/3688
                                                              345/94
2013/0300394 A1  11/2013  Wang et al.

FOREIGN PATENT DOCUMENTS

CN  102708824 A  10/2012
CN  109493806 A  3/2019
(Continued)

OTHER PUBLICATIONS

First Office Action issued in counterpart Chinese Patent Application No. 202311316104.9, dated Nov. 23, 2023.
(Continued)

*Primary Examiner* — Chanh D Nguyen
*Assistant Examiner* — Gloryvid Figueroa-Gibson
(74) *Attorney, Agent, or Firm* — Westbridge IP LLC

(57) ABSTRACT

Disclosed are a gate row driving circuit and a driving method thereof, and a display substrate. The gate row driving circuit includes: an input module; a driving module, configured to connect to a pixel driving voltage output by the input module and provide a pixel power supply voltage to power a current pixel row under drive of the pixel driving voltage; a thermoelectric module, configured to perform thermoelectric conversion on operating heat when the operating heat of the driving module matches preset charging heat to obtain compensation power; and a capacitor module. The driving module is also configured to superimpose a charging voltage continuously generated by the capacitor module onto the pixel driving voltage after the thermoelectric module charges the capacitor module according to the compensation power to obtain an updated pixel driving voltage.

10 Claims, 5 Drawing Sheets

(52) U.S. Cl.
CPC ... *G09G 2330/021* (2013.01); *G09G 2354/00* (2013.01); *H10N 10/80* (2023.02)

(56) References Cited

FOREIGN PATENT DOCUMENTS

| | | |
|---|---|---|
| CN | 111292700 A | 6/2020 |
| CN | 111486979 A | 8/2020 |
| KR | 100727302 B1 | 6/2007 |

OTHER PUBLICATIONS

Notification to Grant Patent Right for Invention issued in counterpart Chinese Patent Application No. 202311316104.9, dated Dec. 9, 2023.

\* cited by examiner supplying, via the driving module, the pixel driving voltage output by the input module, and providing, via the driving module, the pixel power supply voltage under the drive of the pixel driving voltage to power the current pixel row ——S10 when the operating heat of the drive module in the power supply mode matches the preset charging heat, performing thermoelectric conversion on the operating heat through the thermoelectric module to obtain compensation power ——S20 after the thermoelectric module charges the capacitor module according to the compensation power, superimposing the charging voltage continuously generated by the capacitor module onto the pixel driving voltage to obtain an updated pixel driving voltage, and providing, via the drive module, the pixel power supply voltage to power the current pixel row under the drive of the pixel driving voltage according to the updated pixel driving voltage ——S30

FIG. 5

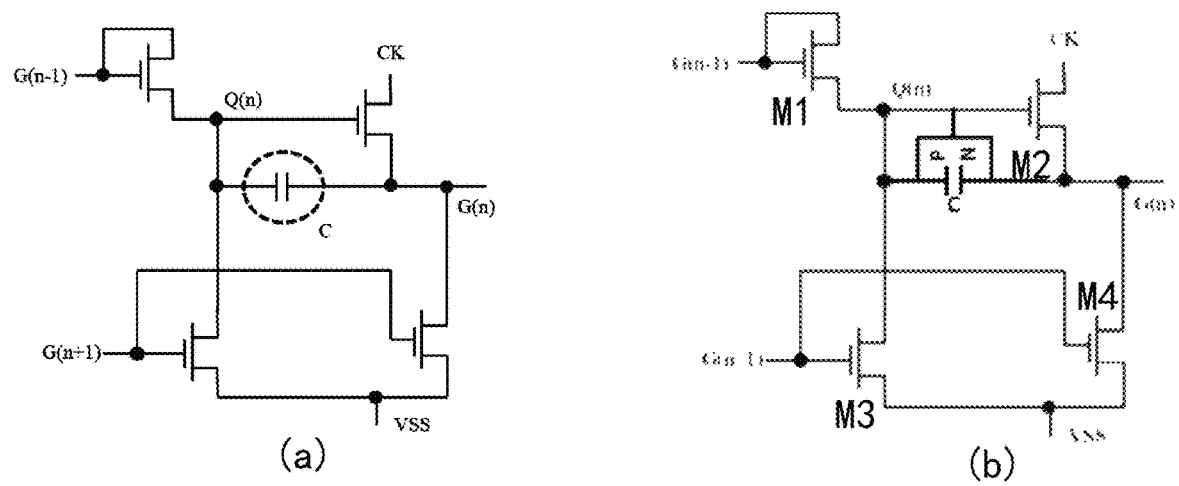

FIG. 6

GATE ROW DRIVING CIRCUIT AND DRIVING METHOD THEREOF, AND DISPLAY SUBSTRATE

CROSS-REFERENCE TO RELATED APPLICATIONS

The present application claims priority to Chinese Patent Application No. 202311316104.9, filed on Oct. 12, 2023, the entire contents of which are incorporated herein by reference.

TECHNICAL FIELD

The present application relates to the technical field of display panels, and in particular to a gate row driving circuit and a driving method thereof, and a display substrate.

BACKGROUND

With the development of the times and the advancement of technology, people have become increasingly picky about the appearance requirements of mobile phones and other products, which has promoted the continuous development of electronic products in the direction of being light, thin and power-saving. In-cell (IN CELL) touch technology can effectively reduce the thickness of mobile phones and other products and is becoming more and more widely used.

Screens using IN CELL technology have the advantages of lighter products, lower thickness, better light transmittance, reduced screen bonding time, and improved production efficiency. However, the screens using IN CELL technology will have some problems when using different methods for touch. The IN CELL panel is divided into two modes during touch display. The first mode is an inter-frame touch drive (Long-V, Long Vertpcal) mode, which means that when displaying a frame, it is divided into a display time period and a touch time period, that is, the touch time period is placed after the display time period, and the sum of the two time periods is the time of one frame; another mode is intra-frame touch drive (Long H, Long Horizontal) mode, which is to insert the touch time period into the display time period in batches when displaying the frame, that is, from top to bottom, a frame will be divided into a cycle of display-touch-display-touch-display. Compared with Long V mode, Long H mode has more accurate touch and shorter response time. However, in the Long H mode, under high temperatures, a Q point (a voltage signal output terminal of the pixel driving voltage output by the input module) will have leakage during the touch stage, which may lead to insufficient charging of the pixels in the next row after the touch, resulting in horizontal streaks. In other words, how to eliminate the abnormality of the display screen in the Long H mode to improve the display quality of the display screen is a technical problem that needs to be solved urgently.

SUMMARY

The main purpose of the present application is to provide a gate row driving circuit and a driving method thereof, and a display substrate, aiming to eliminate the abnormality of the display screen in the Long H mode and improve the display quality of the display screen.

In order to achieve the above purpose, the present application provides a gate row driving circuit, which includes:
an input module;
a driving module connected to the input module, the driving module is configured to connect to a pixel driving voltage output by the input module and provide a pixel power supply voltage to power a current pixel row under drive of the pixel driving voltage;
a thermoelectric module connected to the driving module, the thermoelectric module is configured to perform thermoelectric conversion on operating heat in response to that the operating heat of the driving module matches preset charging heat to obtain compensation power; and
a capacitor module connected to the thermoelectric module and the driving module.

The driving module is also configured to superimpose a charging voltage continuously generated by the capacitor module onto the pixel driving voltage after the thermoelectric module charges the capacitor module according to the compensation power to obtain an updated pixel driving voltage, and provide the pixel power supply voltage to power the current pixel row under the drive of the pixel driving voltage according to the updated pixel driving voltage.

In an embodiment, the capacitor module is a storage capacitor, and the thermoelectric module includes a P-type semiconductor, an N-type semiconductor and a PN node;
a first end of the P-type semiconductor is connected to the PN node; a first end of the N-type semiconductor is connected to the PN node, and the PN node is connected to the driving module; and
a first end of the storage capacitor is connected to a second end of the P-type semiconductor and the driving module, and a second end of the storage capacitor is connected to a second end of the N-type semiconductor.

In an embodiment, the gate row driving circuit further includes:
a discharge module connected to the driving module and a low level terminal, the discharge module is configured to pull down the charging voltage continuously generated by the capacitor module to the low level terminal through the driving module after power supply of the current pixel row is completed.

In an embodiment, the gate row driving circuit further includes: a reset module. The reset module is connected to a first reset terminal, the driving module and the low level terminal, and the reset module is configured to pull down the pixel power supply voltage output by the driving module to the low level terminal in response to a first reset signal input by the first reset terminal. The reset module is connected to a second reset terminal, the input module and the low level terminal, and the reset module is also configured to pull down the pixel driving voltage output by the driving module to the low level terminal in response to a second reset signal input by the second reset terminal.

In an embodiment, the input module is a first thin film transistor; a gate of the first thin film transistor is connected to a signal terminal of a target pixel row, and a source of the first thin film transistor is connected to a high-level voltage terminal; a drain of the first thin film transistor is connected to the driving module and the reset module respectively, and the target pixel row is a previous pixel row of the current pixel row.

In an embodiment, the driving module is a second thin film transistor; a gate of the second thin film transistor is connected to the drain of the first thin film transistor, the reset module, the discharge module, the first end of the storage capacitor and the PN node; a source of the second thin film transistor is connected to a preset signal input terminal, and a drain of the second thin film transistor is configured to output the pixel power supply voltage.

In an embodiment, the reset module includes a third thin film transistor and a fourth thin film transistor; a gate of the third thin film transistor is connected to the first reset terminal, and a gate of the fourth thin film transistor is connected to the second reset terminal; a source of the third thin film transistor and a source of the fourth thin film transistor are both connected to the low level terminal; a drain of the third thin film transistor is supplied with the pixel power supply voltage, and a drain of the fourth thin film transistor is supplied with the pixel driving voltage.

In an embodiment, the discharge module is a fifth thin film transistor; a gate of the fifth thin film transistor is connected to the gate of the second thin film transistor and the drain of the fifth thin film transistor, and a source of the fifth thin film transistor is connected to the low level terminal.

In addition, in order to achieve the above purpose, the present application also provides a driving method for a gate row driving circuit, applied to the gate row driving circuit as described above, including:

inputting, via a driving module, a pixel driving voltage output by an input module, and providing, via the driving module, a pixel power supply voltage to power a current pixel row under drive of the pixel driving voltage;

performing, via a thermoelectric module, thermoelectric conversion on operating heat in response to that the operating heat of the driving module in a power supply mode matches preset charging heat to obtain compensation power; and superimposing a charging voltage continuously generated by a capacitor module onto the pixel driving voltage after the thermoelectric module charges the capacitor module according to the compensation power to obtain an updated pixel driving voltage, and providing, via the driving module, the pixel power supply voltage to power the current pixel row under the drive of the pixel driving voltage according to the updated pixel driving voltage.

In addition, in order to achieve the above purpose, the present application also provides a display substrate, which includes a color filter substrate, a liquid crystal layer and an array substrate, the liquid crystal layer is provided between the array substrate and the color filter substrate, and the array substrate includes the gate row driving circuit as described above.

The present application provides a gate row driving circuit and a driving method thereof, and a display substrate. The present application optimizes the pixel display circuit in the Long H mode and obtains a gate row driving circuit. The gate row driving circuit includes an input module, a drive module, a thermoelectric module and a capacitor module. Due to the high temperature in the Long H mode, the Q point will leak electricity during the touch phase, resulting in a technical problem of insufficient charging of the next row of pixels after the touch. In the present application, through the above modules, when the pixel power supply voltage is provided by the drive module to power the current pixel row under the drive of the pixel driving voltage, the operating heat of the drive module in the power supply mode is collected in real time through the thermoelectric module. When the operating heat matches the preset charging heat, the thermoelectric module performs thermoelectric conversion of the operating heat to obtain the compensation power, thereby achieving the purpose of charging the capacitor module. As a result, the drive module can superimpose the charging voltage continuously generated by the capacitor module on the pixel driving voltage to power the current pixel row after the thermoelectric module charges the capacitor module according to the compensation power. That is to say, in the present application, by providing the thermoelectric module in the gate row driving circuit to connect the drive module and the capacitor module respectively, the thermoelectric module can successfully convert the operating heat generated by the drive module under high-temperature operation into compensation power useful for display through thermoelectric conversion, and charge the capacitor module according to the compensation power, so that the drive module can superimpose the charging voltage continuously generated by the capacitor module onto the pixel driving voltage, thereby enabling the Q point to be continuously charged during high-temperature operation in the Long H mode. This also avoids the occurrence of horizontal stripes due to insufficient charging of the current pixel row caused by leakage at the Q point after the touch ends, thus effectively improving the display quality of the display screen.

BRIEF DESCRIPTION OF THE DRAWINGS

FIG. 5 is a schematic flow chart of a driving method for the gate row driving circuit according to an embodiment of the present application.

FIG. 6 is a schematic structural diagram of a compatible high and low brush in the gate row driving circuit according to an embodiment of the present application.

The realization of the purpose, functional features and advantages of the present application will be further described with reference to the accompanying drawings in conjunction with embodiments.

DETAILED DESCRIPTION OF THE EMBODIMENTS

The technical solutions of the embodiments of the present application will be described clearly and completely below with reference to the accompanying drawings. It is obvious that the embodiments to be described are only some rather than all of the embodiments of the present application. All other embodiments obtained by those skilled in the art based on the embodiments of the present application without creative efforts shall fall within the scope of the present application.

It should be noted that if there are directional indications (such as up, down, left, right, front, back . . . ) in the embodiments of the present application, the directional indications are only used to explain the relative position relationship, motion situation and the like between components in a specific posture (as shown in the accompanying drawings). If the specific posture changes, the directional indication also changes accordingly.

In addition, if there are descriptions related to "first", "second" and the like in the embodiments of the present application, the descriptions of "first", "second" and the like are only for the purpose of description and cannot be understood as indicating or implying their relative importance or implying the number of technical features indicated. Thus, features defined as "first" and "second" may explicitly or implicitly include at least one of these features. In addition, the technical solutions of the various embodiments can be combined with each other, but must be based on what those skilled in the art can implement. When the combination of technical solutions is contradictory or cannot be realized, it should be considered that the combination of such technical solutions does not exist and is not within the scope of the present application.

The embodiments will be described in detail herein, examples of which are illustrated in the accompanying drawings. When the following description refers to the accompanying drawings, the same numbers in different drawings refer to the same or similar elements unless otherwise indicated. The implementations described in the following embodiments do not represent all implementations consistent with the present application.

Figure 1:
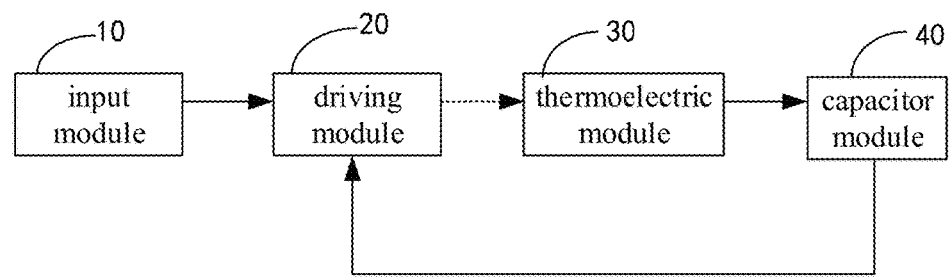
FIG. 1 is a structural block diagram of a gate row driving circuit according to an embodiment of the present application.

The embodiment of the present application provides a gate row driving circuit. Referring to FIG. 1, which is a structural block diagram of the gate row driving circuit according to an embodiment of the present application. The solid arrow in FIG. 1 represents the electrical signal transmission path. The dotted arrow in FIG. 1 represents the temperature signal transmission path.

The gate row driving circuit of the present application includes: an input module 10, a driving module 20, a thermoelectric module 30 and a capacitor module 40. The input module 10 is connected to the driving module 20, and the driving module 20 is connected to the thermoelectric module 30. The capacitor module 40 is connected to the thermoelectric module 30 and the driving module 20 respectively.

In this embodiment, the input module 10 is a first thin film transistor T1; the driving module 20 is a second thin film transistor T2, and the second thin film transistor T2 is the largest TFT transistor in the entire gate row driving circuit. That is, during high-temperature operation in the Long H mode, the heat generated by the second thin film transistor T2 is the highest. The thermoelectric module 30 is a thermocouple, which is composed of an N-type semiconductor and a P-type semiconductor, and a connection node between the N-type semiconductor and the P-type semiconductor is called a PN node. The capacitor module 40 is a storage capacitor C1.

The driving module 20 is configured to connect to a pixel driving voltage output by the input module 10 and provide a pixel power supply voltage to power the current pixel row under the drive of the pixel driving voltage.

Figure 2:
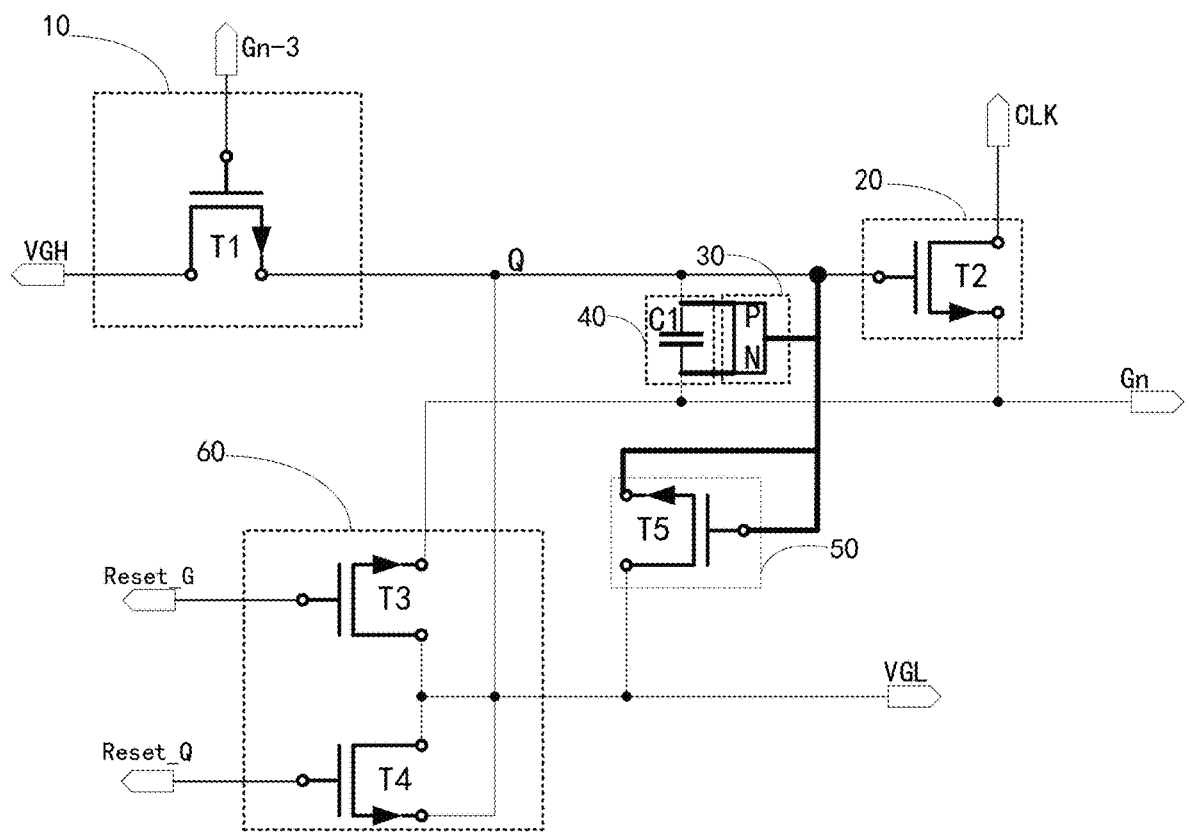
FIG. 2 is a schematic circuit diagram of the gate row driving circuit in a Long H mode according to the present application.

In this embodiment, referring to FIG. 2, which is a schematic circuit diagram of the gate row driving circuit in the Long H mode according to the present application. A gate of the first thin film transistor T1 (i.e., input module 10) is supplied with a gate driving voltage input from a Gn-3 terminal. Under the drive by the gate driving voltage, the first thin film transistor T1 is switched from the off state to the on state. When the first thin film transistor T1 is turned on (that is, when the first thin film transistor T1 is in the on state), according to the connection between the first thin film transistor T1 and the high level terminal, through the path between a source and a drain of the first thin film transistor T1, the pixel driving voltage output by the high level terminal is output by the drain of the first thin film transistor T1 to a gate of the second thin film transistor T2 (i.e., driving module 20) via the voltage signal output terminal (i.e., Q point) of the input module 10. At this time, the gate of the second thin film transistor T2 is supplied with the pixel driving voltage output at the Q point, and under the drive by the pixel driving voltage, the second thin film transistor T2 is switched from the off state to the on state, is supplied with the pixel power supply voltage output by a preset signal input terminal CLK, and outputs the pixel power supply voltage from the drain of the second thin film transistor T2 to the Gn terminal via the path between the source and the drain of the second thin film transistor T2. At this time, the current pixel row is powered according to the pixel power supply voltage supplied from the Gn terminal.

It should be noted that the Gn terminal is the signal terminal of the pixel power supply voltage output by the current pixel row. The pixel power supply voltage is used to represent an electrical signal for normal display of the n-th pixel row, that is, the current pixel row is the n-th pixel row. The Gn-3 terminal is a signal port for outputting the pixel driving voltage of the previous pixel row of the current pixel row. The pixel driving voltage can also be characterized as the electrical signal for normal display of the (n–3)-th pixel row, that is, the previous pixel row of the current pixel row is the (n–3)-th pixel row; where n is a natural number greater than 3. That is to say, each pixel row in the display substrate of the present application is sequentially driven at intervals of (n–3) rows under the control of the gate row driving circuit.

The thermoelectric module 30 is used to perform thermoelectric conversion on the operating heat when the operating heat of the driving module 20 matches the preset charging heat to obtain compensation power.

In this embodiment, referring to FIG. 2, since the driving module 20 (i.e., second thin film transistor T2) is the largest TFT transistor in the entire gate row driving circuit, that is, the heat generated during high-temperature operation in the Long H mode is the highest. In the present application, the PN node of the thermoelectric module 30 is connected to the gate of the second thin film transistor T2, that is, the gate of the second thin film transistor T2 is used as the metal plate of the thermoelectric module 30. When the display substrate is in the touch time period in the Long H mode, the gate of the second thin film transistor T2 is supplied with the gate driving voltage for driving, that is, the gate of the second thin film transistor T2 begins to generate operating heat. When the gate driving duration of the second thin film transistor T2 reaches half of the touch time period, it is determined that the operating heat accumulated in the gate of the second thin film transistor T2 matches the preset charging heat, and the thermoelectric module 30 performs thermoelectric conversion on the accumulated operating heat, to obtain the compensate power. While solving the abnormality of the display screen in the Long H mode, the thermoelectric module 30 performs thermoelectric conversion on the operating heat accumulated by the second thin film transistor T2, and can also increase the life of the second thin film transistor T2 and the use time of the display substrate.

Figure 3:
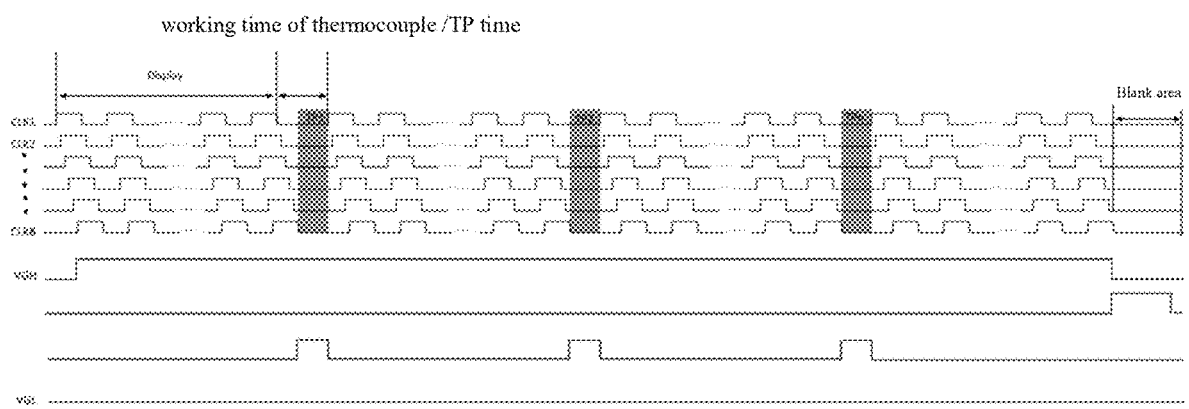
FIG. 3 is a waveform diagram of control by the gate row driving circuit in the Long H mode according to an embodiment of the present application.

It should be noted that, referring to FIG. 3, which is a control waveform diagram of the gate row driving circuit in the Long H mode according to an embodiment of the present application. The touch time period can be the time period from 0 to T. When the display substrate is running in the Long H mode, and the touch time period is $0<T_0<2/T$, the Q point can maintain a stable pixel driving voltage due to the storage capacitor C1, thereby ensuring that the second thin film transistor T2 is turned on under the drive of the pixel driving voltage to power the current pixel row. However, as time goes by, that is, when the touch time period $T_0$ is greater than or equal to 2/T, due to the leakage of the storage capacitor C1 or the increased resistance and coupling capacitor caused by turning on the remote pixel, the pixel driving voltage output at the Q point is not stable enough. After the gate driving time of the second thin film transistor T2 reaches half of the touch time period, the operating heat accumulated in the gate of the second thin film transistor T2 exactly matches the preset charging heat. At this time, the thermoelectric module 30 thermoelectrically converts the accumulated operating heat into compensation power to maintain the normal output of the Q point and ensure the normal charging of the pixels in the Long H mode.

The driving module 20 is also configured to superimpose the charging voltage continuously generated by the capacitor module 40 onto the pixel driving voltage after the thermoelectric module 30 charges the capacitor module 40 according to the compensation power, to obtain an updated pixel driving voltage. According to the updated pixel driving voltage, the pixel power supply voltage is provided to power the current pixel row under the drive of the pixel driving voltage.

In this embodiment, the thermoelectric module 30 thermoelectrically converts the operating heat accumulated in the gate of the driving module 20 into the compensation power, charges the storage capacitor C1, and superimposes the charging voltage continuously generated by the capacitor module 40 onto the pixel driving voltage output at the Q point to obtain the updated pixel driving voltage. The pixel power supply voltage is provided to power the current pixel row under the drive of the pixel driving voltage according to the updated pixel driving voltage, thereby ensuring that the display substrate continuously charges the Q point during the touch phase in the Long H mode. That is, when the touch function of the display substrate ends in the Long H mode, the Q point will not appear horizontal stripes due to insufficient charging of the pixel caused by leakage, thus improving the display quality of the display screen.

Figure 4:
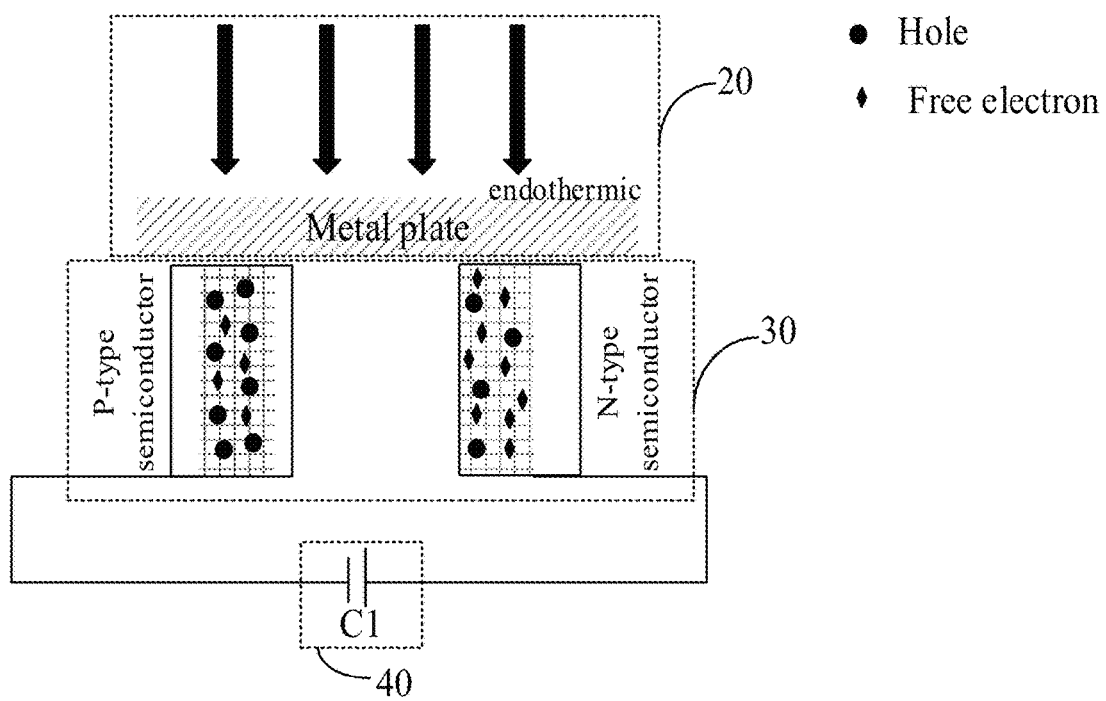
FIG. 4 is a schematic diagram of conversion by the thermoelectric module in the gate row driving circuit according to an embodiment of the present application.

Further, in some embodiments, referring to FIG. 4, which is a schematic diagram of conversion by the thermoelectric module in the gate row driving circuit according to an embodiment of the present application. The capacitor module is a storage capacitor, and the thermoelectric module includes a P-type semiconductor, an N-type semiconductor and a PN node. A first end of the P-type semiconductor is connected to the PN node, and the first end of the N-type semiconductor is connected to the PN node. The PN node is connected to the driving module. The first end of the storage capacitor is connected to a second end of the P-type semiconductor and the driving module, and the second end of the storage capacitor is connected to the second end of the N-type semiconductor.

In this embodiment, referring to FIG. 4, when the operating heat of the driving module 20 matches the preset charging heat, the P-type semiconductor in the thermoelectric module 30 has a majority of holes and a small number of electrons, and the holes after heating move faster, so that free electrons will be squeezed and move toward the outside. In the N-type semiconductor, free electrons account for the majority and the number of holes is small. After heating, the holes will move toward the P-type semiconductor. A current is generated between the P-type and N-type semiconductors, and a direction of the current is from the N-type semiconductor to the P-type semiconductor.

It should be noted that P-type semiconductor is formed by doping single crystal silicon with trace amounts of indium, aluminum, boron, gallium and other elements. Many holes lacking electrons will be generated in the conductor. Semiconductors that rely on holes to conduct electricity are called hole semiconductors, or P-type semiconductors for short.

The N-type semiconductor is formed by doping single crystal silicon with trace amounts of antimony, phosphorus, arsenic and other elements. Many negatively charged electrons are generated in the semiconductor. Semiconductors that rely on electrons to conduct electricity are called electronic semiconductors, or N-type semiconductors for short.

In a specific embodiment, the P-type semiconductor and the N-type semiconductor are formed by doping on single crystal silicon. During the manufacturing process of the display screen, before a first layer of metal is prepared, the glass where the thermoelectric converter needs to be loaded is doped to make it be the P-type semiconductor and the N-type semiconductor. After the production is completed, because the main component of the substrate glass is $SiO_2$, there is no rejection reaction.

Further, in another embodiment, the present application can first conduct design evaluation on the plain glass, record coordinates of the position where the gate driver on array (GOA) unit is placed, and derive a set of data, so that the glass factory performs doping treatment on the coordinate position during the manufacturing process of the display glass to form the P-type semiconductor and the N-type semiconductor at the coordinate positions. The first layer of metal M1 is deposited on the processed glass substrate, and the thermoelectric module 30 will be formed at the second thin film transistor T2 in the GOA unit, which will not affect the manufacturing process of each film layer of the display screen.

Further, in other embodiments, the gate row driving circuit further includes a discharge module 50.

The discharge module 50 is connected to the driving module 20 and a low level respectively. The discharge module 50 is configured to discharge the charging voltage continuously generated by the capacitor module 40 through the driving module 20 after the power supply of the current pixel row is completed to the low level.

It should be noted that the discharge module 50 is a fifth thin film transistor T5.

In this embodiment, referring to FIG. 2 to FIG. 3, when the display substrate operates in the Long H mode, and the touch time period $T_0$ is greater than or equal to 2/T, the operating heat generated by the driving module 20 is accumulated to enough to turn on the thermocouple. The touch time period $T_0$ is in the time period of T/2-T. Since the storage capacitor C1 needs to maintain the stability of the output of the second thin film transistor T2, the thermoelectric module 30 thermoelectrically converts the operating heat into the compensation power to continuously supply power to the storage capacitor C1. When charging of a certain pixel row ends, during the display period of this frame, the second thin film transistor T2 will generates a certain amount of electricity because the heat generated by the environment or itself is not dissipated. However, at this time, there will be no loss in the capacitor and the capacitor has reached a saturated state. The fifth thin film transistor T5 pulls down the charging voltage continuously generated by the capacitor module 40 to the low level terminal VGL through the driving module 20, so as to discharge the excess power of the capacitor module 40 to the low level terminal VGL without affecting the circuit.

In a specific embodiment, when the touch time period $T_0$ is in the time period of T/2-T, the thermoelectric module 30 thermoelectrically converts the operating heat into the compensation power to continuously supply power to the storage capacitor C1. Because the storage capacitor C1 and the fifth thin film transistor T5 are connected in series, and two components connected in series have a voltage dividing effect. For two components connected in series, the greater the resistance, the more the voltage divided, that is, when the storage capacitor C1 needs to be charged, the fifth thin film transistor T5 will not be turned on, and there will be no problem of erroneous discharge. When the touch time period $T_0$ reaches time T, the storage capacitor C1 has been saturated, which is equivalent to the off state, and the fifth thin film transistor T5 will be turned on, causing the excess electricity in the circuit to be discharged to the low level terminal VGL.

Further, in some embodiments, the gate row driving circuit also includes a reset module 60. The reset module 60 is connected to a first reset terminal, the driving module 20 and the low level terminal VGL respectively. The reset module 60 is configured to pull down the pixel power supply voltage output by the driving module 20 to the low level terminal in response to a first reset signal input from the first reset terminal. The reset module 60 is connected to a second reset terminal, the input module 10 and the low level terminal respectively. The reset module 60 is also configured to pull down the pixel driving voltage output by the input module 10 to the low level terminal in response to a second reset signal input from the second reset terminal.

It should be noted that the reset module 60 includes a third thin film transistor T3 and a fourth thin film transistor T4.

In this embodiment, the first reset signal Reset_G of the first reset terminal is input to the third thin film transistor T3. The first reset signal Reset_G is configured to turn on the third thin film transistor T3 to pulled down the pixel power supply voltage (i.e., Gn signal) output by the current pixel row to the low level terminal. The fourth thin film transistor T4 is supplied with the second reset signal Reset_Q of the second reset terminal. The second reset signal Reset_Q is configured to turn on the fourth thin film transistor T4 to pull down the pixel driving voltage at the Q point to the low level terminal. As a result, the gate row driving circuit remains stable, while no wrong charging will occur.

Further, in some embodiments, the input module 10 is a first thin film transistor T1. The gate of the first thin film transistor T1 is connected to the signal terminal of the target pixel row. The source of the first thin film transistor T1 is connected to a high-level voltage terminal VGH, the drain of the first thin film transistor T1 is connected to the driving module 20 and the reset module 60 respectively, and the target pixel row is the previous pixel row of the current pixel row.

Further, in some embodiments, the driving module is a second thin film transistor T2.

The gate of the second thin film transistor T2 is connected to the drain of the first thin film transistor T1, the reset module 60, the discharge module 50, the first end of the storage capacitor C1 and the PN node respectively. The source of the second thin film transistor T2 is connected to the preset signal input terminal CLK, and the drain of the second thin film transistor T2 outputs the pixel power supply voltage.

In this embodiment, when the second thin film transistor T2 is turned on, the second thin film transistor T2 is supplied with the pixel power supply voltage output by the preset signal input terminal CLK according to the operation cycle of the gate row driving circuit. Specifically, in the display control circuit, the number of pixel rows is greater than 2 as one running cycle for updating. For example, in the display control circuit, 4, 6, 8 or 10 rows of pixels are updated as one running cycle.

Further, in other embodiments, the reset module includes the third thin film transistor T3 and the fourth thin film transistor T4. The gate of the third thin film transistor T3 is connected to the first reset terminal, the gate of the fourth thin film transistor T4 is connected to the second reset terminal, and the source of the third thin film transistor T3 and the source of the fourth thin film transistor T4 are both connected to the low level terminal. The drain of the third thin film transistor T3 is supplied with the pixel power supply voltage, and the drain of the fourth thin film transistor T4 is supplied with the pixel driving voltage.

Further, in some embodiments, the discharge module is the fifth thin film transistor T5. The gate of the fifth thin film transistor T5 is connected to the gate of the second thin film transistor T2 and the drain of the fifth thin film transistor T5 respectively, and the source of the fifth thin film transistor T5 is connected to the low level terminal VGL.

In summary, the present application provides a gate row driving circuit and a driving method thereof, and a display substrate. The present application optimizes the pixel display circuit in the Long H mode and obtains a gate row driving circuit. The gate row driving circuit includes an input module, a drive module, a thermoelectric module and a capacitor module. Due to the high temperature in the Long H mode, the Q point will leak electricity during the touch phase, resulting in a technical problem of insufficient charging of the next row of pixels after the touch. In the present application, through the above modules, when the pixel power supply voltage is provided by the drive module to power the current pixel row under the drive of the pixel driving voltage, the operating heat of the drive module in the power supply mode is collected in real time through the thermoelectric module. When the operating heat matches the preset charging heat, the thermoelectric module performs thermoelectric conversion of the operating heat to obtain the compensation power, thereby achieving the purpose of charging the capacitor module. As a result, the drive module can superimpose the charging voltage continuously generated by the capacitor module on the pixel driving voltage to power the current pixel row after the thermoelectric module charges the capacitor module according to the compensation power. That is to say, in the present application, by providing the thermoelectric module in the gate row driving circuit to connect the drive module and the capacitor module respectively, the thermoelectric module can successfully convert the operating heat generated by the drive module under high-temperature operation into compensation power useful for display through thermoelectric conversion, and charge the capacitor module according to the compensation power, so that the drive module can superimpose the charging voltage continuously generated by the capacitor module onto the pixel driving voltage, thereby enabling the Q point to be continuously charged during high-temperature operation in the Long H mode. This also avoids the occurrence of horizontal stripes due to insufficient charging of the current pixel row caused by leakage at the Q point after the touch ends, thus effectively improving the display quality of the display screen.

Further, based on the gate row driving circuit according to the embodiment of the present application, a driving method for the gate row driving circuit according to another embodiment of the present application is proposed. Referring to FIG. 5, which is a flow chart of the driving method for the gate row driving circuit according to another embodiment of the present application.

The driving method for the gate row driving circuit of the present application is applied to any of the above gate row driving circuits. The driving method for the gate row driving circuit of the present application is executed by a terminal device that supplies power to the pixel row. The driving method for the gate row driving circuit of the present application includes the following steps.

Step S10, supplying, via the driving module 20, the pixel driving voltage output by the input module 10, and providing, via the driving module 20, the pixel power supply voltage under the drive of the pixel driving voltage to power the current pixel row.

In this embodiment, referring to FIG. 1 to FIG. 2, the gate driving voltage input from the Gn-3 terminal is input to the gate of the first thin film transistor T1 (i.e., the input module 10), and the first thin film transistor T1 is switched from the off state to the on state under the driving of the gate driving voltage. When the first thin film transistor T1 is turned on (that is, when the first thin film transistor T1 is in the on state), according to the connection between the first thin film transistor T1 and the high level terminal, through the path between the source of the first thin film transistor T1 and the drain of the first thin film transistor T1, the pixel driving voltage output by the high level terminal is output by the drain of the first thin film transistor T1 to the gate of the second thin film transistor T2 (i.e., driving module 20) via the voltage signal output terminal of the input module 10 (i.e., Q point). At this time, the pixel driving voltage output at the Q point is input to the gate of the second thin film transistor T2. Under drive by the pixel driving voltage, the second thin film transistor T2 is switched from the off state to the on state. The pixel power supply voltage output by the preset signal input terminal CLK is supplied, and the pixel power supply voltage is output by the drain of the second thin film transistor T2 to the Gn terminal through the path between the source of the second thin film transistor T2 and the drain of the second thin film transistor T2. At this time, the current pixel row is powered according to the pixel power supply voltage input to the Gn terminal.

It should be noted that the Gn terminal is the signal terminal at which the current pixel row outputs the pixel power supply voltage. The pixel power supply voltage is used to represent the electrical signal for normal display of the n-th pixel row, that is, the current pixel row is the n-th pixel row. Gn-3 terminal is the signal port at which the previous pixel row of the current pixel row outputs the pixel driving voltage. The pixel driving voltage can also be characterized as the electrical signal for normal display of the (n−3)-th pixel row, that is, the previous pixel row of the current pixel row is the (n−3)-th pixel row, where n is a natural number greater than 3. That is to say, each pixel row in the display substrate of the present application is sequentially driven at intervals of (n−3) rows under the control of the gate row driving circuit.

Step S20, when the operating heat of the drive module in the power supply mode matches the preset charging heat, performing thermoelectric conversion on the operating heat through the thermoelectric module to obtain compensation power.

In this embodiment, referring to FIG. 2, since the driving module 20 (i.e., second thin film transistor T2) is the largest TFT transistor in the entire gate row driving circuit, that is, the heat generated during high-temperature operation in the Long H mode is the highest. In the present application, the PN node of the thermoelectric module 30 is connected to the gate of the second thin film transistor T2, that is, the gate of the second thin film transistor T2 is used as the metal plate of the thermoelectric module 30. When the display substrate is in the touch time period in the Long H mode, the gate driving voltage is input to the gate of the second thin film transistor T2 for driving, that is, the gate of the second thin film transistor T2 begins to generate operating heat. When the gate driving duration of the second thin film transistor T2 reaches half of the touch time period, it is determined that the operating heat accumulated in the gate of the second thin film transistor T2 matches the preset charging heat, and the thermoelectric module 30 performs thermoelectric conversion on the accumulated operating heat to obtain the compensate power. While solving the abnormality of the display screen in the Long H mode, the thermoelectric module 30 performs thermoelectric conversion on the operating heat accumulated in the second thin film transistor T2, which can also improve the life of the second thin film transistor T2 and the use time of the display substrate.

It should be noted that, referring to FIG. 3, which is a waveform diagram of control by the gate row driving circuit in the Long H mode according to an embodiment the present application. The touch time period $T_0$ can include the period from 0 to T. When the display substrate is operating in the Long H mode, and the touch time period $T_0$ is greater than 0 and less than 2/T, the Q point can maintain a stable pixel driving voltage due to the storage capacitor C1, thereby ensuring that the second thin film transistor T2 is turned on by driven of the pixel driving voltage to power the current pixel row. However, as time goes by, that is, when the touch time period $T_0$ is greater than or equal to 2/T, the pixel driving voltage output by the Q point is not stable enough due to the leakage of the storage capacitor C1 or the increase in resistance and coupling capacitance due to opening of the remote pixel. After the gate driving duration of the second thin film transistor T2 reaches half of the touch time period, the operating heat accumulated in the gate of the second thin film transistor T2 exactly matches the preset charging heat. At this time, the thermoelectric module 30 thermoelectrically converts the accumulated operating heat into the compensation power to maintain the normal output of the Q point, ensuring normal charging of the pixel in the Long H mode.

Step S30, after the thermoelectric module charges the capacitor module according to the compensation power, superimposing the charging voltage continuously generated by the capacitor module onto the pixel driving voltage to obtain an updated pixel driving voltage, and providing, via the drive module, the pixel power supply voltage to power the current pixel row under the drive of the pixel driving voltage according to the updated pixel driving voltage.

In this embodiment, the thermoelectric module 30 thermoelectrically converts the operating heat accumulated in the gate of the driving module 20 into the compensation power, charges the storage capacitor C1, and then superimposes the charging voltage continuously generated by the capacitor module 40 onto the pixel driving voltage output at the Q point to obtain the updated pixel driving voltage. According to the updated pixel driving voltage, the pixel power supply voltage is provided to power the current pixel row under the drive of the pixel driving voltage, thereby ensuring that the display substrate continuously charges the Q point during the touch phase in the Long H mode. That is, when the touch function of the display substrate ends in the Long H mode, the Q point will not appear the horizontal stripes due to insufficient pixel charging caused by leakage, thus improving the display quality of the display screen.

Further, in another embodiment, referring to FIG. 6, which is a schematic structural diagram of a compatible high and low brush of the gate row driving circuit according to an embodiment of the present application. In daily life, mobile phones are used in various scenarios, so the requirement for the screen is to be compatible with high and low brushes. The charging time of the high brush is shorter, and the charging time of the low brush is relatively long, so each row of pixels is required to be turned on for a longer time, and the Q point in the gate row driving circuit is required to maintain for a longer time. As shown in FIG. 6(*a*), a maintenance capability of the Q(n) point is determined by the capacitor C. The larger the capacitor C, the stronger the maintenance capacity of the Q(n) point. However, the larger the capacitor C, the wider the border of the screen and the smaller the screen-to-body ratio. In the present application, the thermoelectric module 30 is provided at a relative position to the capacitor C, and the thermoelectric effect of the thermoelectric module 30 is used to compensate the capacitor C in the GOA area. The size of the capacitor C in the GOA circuit can be controlled within a certain range, so that the Border of the display screen is reduced, resulting in a higher screen-to-body ratio for the special-shaped display screen. That is to say, when compatible with high and low brush modes, the present application adds a device that converts thermal energy into electrical energy without changing the panel manufacturing process, and loads it in FIG. 6(*a*) to generate FIG. 6(*b*). Because the thin film transistor M2 in the gate row driving circuit belongs to the output unit and is the largest thin film transistor in the entire gate row driving circuit, the heat generated during high-temperature operation is the highest, that is, the thermoelectric module 30 is connected to the gate of the thin film transistor M2, the gate of the thin film transistor M2 is used as the top metal of the conversion device (i.e., the thermoelectric module 30). As shown in FIG. 4, the heat generated by the gate of the thin film transistor M2 is converted into electrical energy using the Perjet thermoelectric effect to charge the capacitor C, thereby ensure that the Q(n) point can always remain at high voltage when the refresh rate is low, without affecting the charging of pixels in this row.

It should be noted that M1~M4 in FIG. 6 are all thin film transistors, also called TFT transistors.

Figure 7:
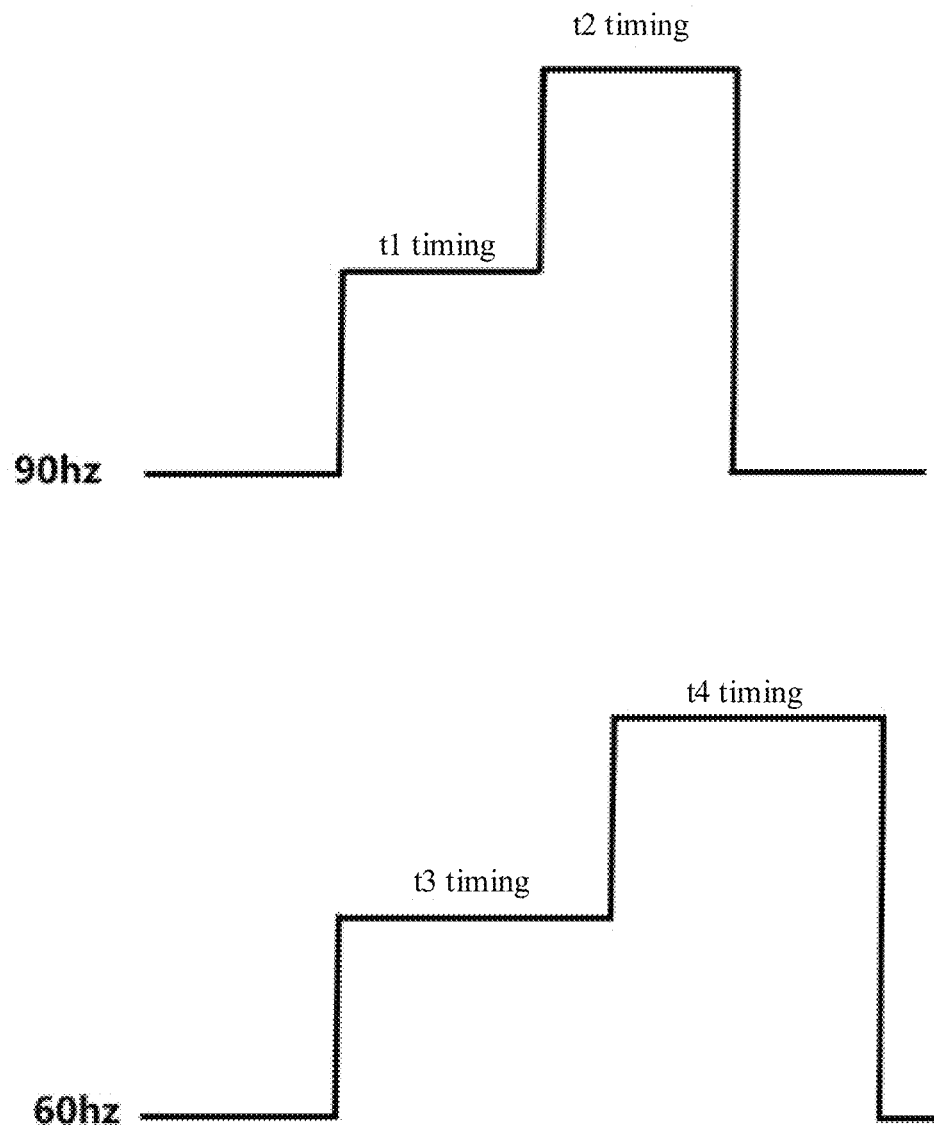
FIG. 7 is a schematic diagram of low and high frequency waveforms in the gate row driving circuit according to an embodiment of the present application.
Figure 8:
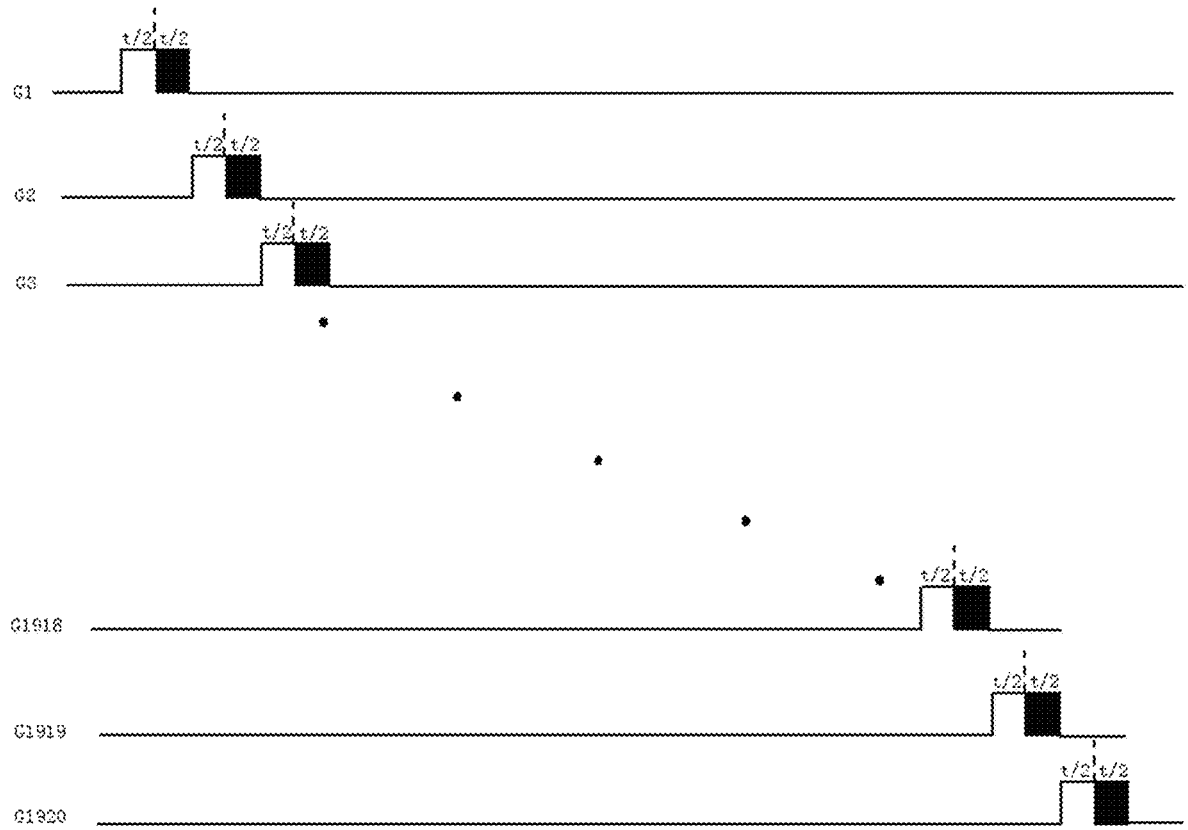
FIG. 8 is a low-brush Q(n) point waveform diagram of the gate row driving circuit according to an embodiment of the present application.

In a specific embodiment, referring to FIG. 7, which is a schematic diagram of low and high frequency waveforms of the gate row driving circuit according to an embodiment of the present application. By comparing the waveform diagrams of 60 Hz and 90 Hz, it can be seen that in the same time period, 60 Hz t3 and t4 time periods are greater than 90 Hz t1 and t2 time periods, it can be concluded that the Q(n) point needs to maintain high voltage for a longer time under low frequency state, and the ability of capacitor C to hold charges must be stronger. Specifically, referring to FIG. 8, which is a low-brush Q(n) point waveform diagram of the gate row driving circuit according to an embodiment of the present application. The thermoelectric effect converts heat into electrical energy, and the conversion relationship is that heat and electrical energy are proportional. The low refresh rate is due to the long charging time during the charging process of each row of pixels. The longer the time, the more difficult it is for the Q(n) point to maintain a stable voltage. For example, a period of T is used for charging. In the first period of T/2, Q(n) point can maintain a stable voltage due to capacitance, thus turning on the TFT to charge the pixel. However, in the last period of T/2, due to leakage of the capacitor C or the increased resistance and coupling capacitance caused by turning on the remote pixel, the voltage output at the Q(n) point is not stable enough. At this time, this level of GOA unit works for a long time, and the TFT generates a certain amount of heat. The thermoelectric effect is just used to convert heat energy into electrical energy to maintain the normal output of the Q(n) point and ensure the normal charging of the pixels under low refresh. At this time, the startup time of the thermoelectric device is the second half of the charging time of each row of pixels.

According to the heat formula $Q(n)=I^2RT_0$, the gate line of each row of pixels will have a certain resistance, which is represented by R1. The working time of each row of pixels is represented by t. It can be seen that during the process of current transfer from left to right, the change of R1 is from small to large, and the transfer time is also gradually increased, so Q(n) increases with the increase of R and $T_0$. When R is R1 and $T_0$ is t, Q(n) reaches the maximum value. According to the heat formula, it can be seen that in the process of converting heat into electrical energy, when $T_0$ is less than or equal to t/2, the heat generated before R is less than or equal to R1/2 is small, which is not enough to make the thermocouple start working. When R is greater than or equal to R1/2 and $T_0$ is greater than or equal to t/2, the heat generated is relatively high. At this time, the thermocouple starts to work, and converts the heat in the circuit into electrical energy to maintain the stability of the Q(n) point. That is to say, the present application bridges a conversion module in the circuit without changing the original structure of the display screen, so that the heat energy generated by the circuit under high-temperature operation is successfully converted into electrical energy useful for display. As a result, the life of the TFT and usage time of the display screen are increased, while the problem of unstable charging of the pixel at the low refresh rate is solved.

In addition, the present application also provides a terminal device. Please referring to FIG. 9, which is a schematic structural diagram of a terminal device according to an embodiment of the present application. The terminal device in the embodiment of the present application can specifically be a device that locally runs the driving method for the gate row driving circuit.

Figure 9:
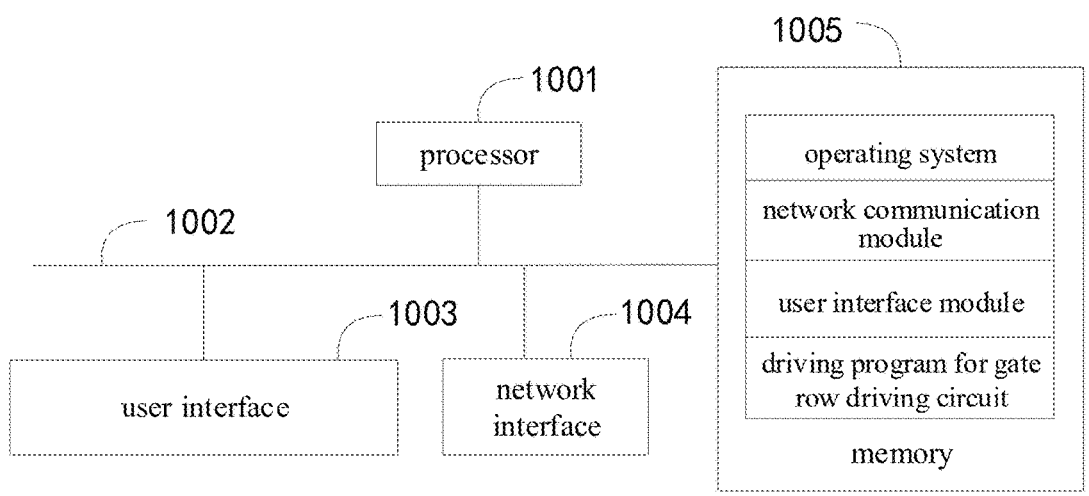
FIG. 9 is a schematic structural diagram of a terminal device according to an embodiment of the present application.

As shown in FIG. 9, the terminal device in this embodiment of the present application can include: a processor 1001 such as a CPU, a communication bus 1002, a user interface 1003, a network interface 1004, and a memory 1005. The communication bus 1002 is configured to realize connection communication between these components. The user interface 1003 can include a display screen and an input unit such as a keyboard. The user interface 1003 can optionally include a standard wired interface and a wireless interface. The network interface 1004 can optionally include a standard wired interface or a wireless interface (such as a Wi-Fi interface).

The memory 1005 is provided on the main body of the terminal device, and a program is stored in the memory 1005. When the program is executed by the processor 1001, corresponding operations are implemented. The memory 1005 is also used to store parameters for use by the terminal device. The memory 1005 can be a high-speed RAM memory or a stable memory (non-volatile memory), such as a disk memory. The memory 1005 can optionally be a storage device independent of the aforementioned processor 1001.

Those skilled in the art can understand that the structure of the terminal device shown in FIG. 9 does not constitute a limitation on the terminal device, and can include more or fewer components than shown in the figure, or a combination of certain components, or differently arranged components.

As shown in FIG. 9, the memory 1005 as a storage medium can include an operating system, a network communication module, a user interface module, and a driving program for the gate row driving circuit of the terminal device.

In the terminal device shown in FIG. 9, the processor 1001 can be used to call the driving program for the gate row driving circuit of the terminal device stored in the memory 1005 and execute the steps of the display screen control method as described above.

In addition, the present application also provides a display substrate. The display substrate includes a color filter substrate, a liquid crystal layer and an array substrate. The liquid crystal layer is provided between the array substrate and the color filter substrate. The array substrate includes any of the above gate row driving circuits.

It should be noted that in this document, the terms "include", "comprise" or any other variants thereof are intended to cover a non-exclusive inclusion. Thus, a process, method, article or device that includes a series of elements not only includes those elements, but also includes other elements that are not expressly listed, or also includes elements inherent to the process, method, article or device. If there are no more restrictions, the element defined by the sentence "including a . . . " does not exclude the existence of other identical elements in the process, method, article or device that includes the element.

The above serial numbers of the embodiments of the present application are only for description and do not represent the advantages and disadvantages of the embodiments.

Through the above description of the embodiments, those skilled in the art can clearly understand that the methods of the above embodiments can be implemented by means of software and the necessary general hardware platform. Of course, it can also be implemented by hardware, but in many cases the former is better implementation. Based on this understanding, the technical solution of the present application, or the part that contributes to the existing technology, can essentially be embodied in the form of a software product. The computer software product is stored in one of the above storage media (such as ROM/RAM, magnetic disk, optical disk), including several instructions to cause a terminal device (which can be a mobile phone, computer, server, or network device, etc.) to execute the method of each embodiment of the present application.

The above are only preferred embodiments of the present application, and are not intended to limit the patent scope of the present application. Any equivalent structure or equivalent process transformation made using the contents of the description and drawings of the present application, or directly or indirectly applied in other related technical fields, are equally included in the scope of the present application.

What is claimed is:

1. A gate row driving circuit, comprising:
an input module;
a driving module connected to the input module, wherein the driving module is configured to connect to a pixel driving voltage output by the input module and provide a pixel power supply voltage to power a current pixel row under drive of the pixel driving voltage;
a thermoelectric module connected to the driving module, wherein the thermoelectric module is configured to perform thermoelectric conversion on operating heat in response to that the operating heat of the driving module matches preset charging heat to obtain compensation power; and
a capacitor module connected to the thermoelectric module and the driving module;
wherein the driving module is also configured to superimpose a charging voltage continuously generated by the capacitor module onto the pixel driving voltage after the thermoelectric module charges the capacitor module according to the compensation power to obtain an updated pixel driving voltage, and provide the pixel power supply voltage to power the current pixel row under the drive of the pixel driving voltage according to the updated pixel driving voltage.

2. The gate row driving circuit of claim 1, wherein the capacitor module is a storage capacitor, and the thermoelectric module comprises a P-type semiconductor, an N-type semiconductor and a PN node;
a first end of the P-type semiconductor is connected to the PN node; a first end of the N-type semiconductor is connected to the PN node, and the PN node is connected to the driving module; and
a first end of the storage capacitor is connected to a second end of the P-type semiconductor and the driving module, and a second end of the storage capacitor is connected to a second end of the N-type semiconductor.

3. The gate row driving circuit of claim 2, further comprising:
a discharge module connected to the driving module and a low level terminal, wherein the discharge module is configured to pull down the charging voltage continuously generated by the capacitor module to the low level terminal through the driving module after power supply of the current pixel row is completed.

4. The gate row driving circuit of claim 3, further comprising:
a reset module;
wherein the reset module is connected to a first reset terminal, the driving module and the low level terminal, and the reset module is configured to pull down the pixel power supply voltage output by the driving module to the low level terminal in response to a first reset signal input by the first reset terminal; and
wherein the reset module is connected to a second reset terminal, the input module and the low level terminal, and the reset module is also configured to pull down the pixel driving voltage output by the driving module to the low level terminal in response to a second reset signal input by the second reset terminal.

5. The gate row driving circuit of claim 4, wherein the input module is a first thin film transistor; a gate of the first thin film transistor is connected to a signal terminal of a target pixel row, and a source of the first thin film transistor is connected to a high-level voltage terminal; a drain of the first thin film transistor is connected to the driving module and the reset module respectively, and the target pixel row is a previous pixel row of the current pixel row.

6. The gate row driving circuit of claim 5, wherein the driving module is a second thin film transistor; a gate of the second thin film transistor is connected to the drain of the first thin film transistor, the reset module, the discharge module, the first end of the storage capacitor and the PN node; a source of the second thin film transistor is connected to a preset signal input terminal, and a drain of the second thin film transistor is configured to output the pixel power supply voltage.

7. The gate row driving circuit of claim 6, wherein the reset module comprises a third thin film transistor and a fourth thin film transistor; a gate of the third thin film transistor is connected to the first reset terminal, and a gate of the fourth thin film transistor is connected to the second reset terminal; a source of the third thin film transistor and a source of the fourth thin film transistor are both connected to the low level terminal; a drain of the third thin film transistor is supplied with the pixel power supply voltage, and a drain of the fourth thin film transistor is supplied with the pixel driving voltage.

8. The gate row driving circuit of claim 7, wherein the discharge module is a fifth thin film transistor; a gate of the fifth thin film transistor is connected to the gate of the second thin film transistor and the drain of the fifth thin film transistor, and a source of the fifth thin film transistor is connected to the low level terminal.

9. A driving method for a gate row driving circuit, applied to the gate row driving circuit of claim 1, comprising:
   inputting, via a driving module, a pixel driving voltage output by an input module, and providing, via the driving module, a pixel power supply voltage to power a current pixel row under drive of the pixel driving voltage;
   performing, via a thermoelectric module, thermoelectric conversion on operating heat in response to that the operating heat of the driving module in a power supply mode matches preset charging heat to obtain compensation power; and
   superimposing a charging voltage continuously generated by a capacitor module onto the pixel driving voltage after the thermoelectric module charges the capacitor module according to the compensation power to obtain an updated pixel driving voltage, and providing, via the driving module, the pixel power supply voltage to power the current pixel row under the drive of the pixel driving voltage according to the updated pixel driving voltage.

10. A display substrate, comprising a color filter substrate, a liquid crystal layer and an array substrate, wherein the liquid crystal layer is provided between the array substrate and the color filter substrate, and the array substrate comprises the gate row driving circuit of claim 1.

* * * * *